United States Patent
Kobayashi et al.

(10) Patent No.: US 11,729,959 B2
(45) Date of Patent: Aug. 15, 2023

(54) MOUNTING SUBSTRATE MANUFACTURING SYSTEM, COMPONENT MOUNTING SYSTEM, AND HOUSING BODY TRANSFER METHOD

(71) Applicant: Panasonic Intellectual Property Management Co., Ltd., Osaka (JP)

(72) Inventors: Hiroki Kobayashi, Fukuoka (JP); Ryouji Eguchi, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 100 days.

(21) Appl. No.: 17/221,986

(22) Filed: Apr. 5, 2021

(65) Prior Publication Data

US 2021/0227736 A1     Jul. 22, 2021

Related U.S. Application Data

(63) Continuation of application No. PCT/JP2018/038373, filed on Oct. 15, 2018.

(51) Int. Cl.
    *H05K 13/04*     (2006.01)
(52) U.S. Cl.
    CPC ..... *H05K 13/0408* (2013.01); *H05K 13/0417* (2013.01)
(58) Field of Classification Search
    CPC .............. H05K 13/0408; H05K 13/0417
    See application file for complete search history.

(56) References Cited

U.S. PATENT DOCUMENTS 9,814,168 B2 * 11/2017 Iisaka .................... H05K 13/02
10,271,469 B2 * 4/2019 Tanokuchi ......... H05K 13/0419
(Continued)

FOREIGN PATENT DOCUMENTS

| CN | 1550127 A | 11/2004 |
|---|---|---|
| CN | 108260340 A | 7/2018 |

(Continued)

OTHER PUBLICATIONS

Chinese Office Action with its partial English translation issued in the corresponding Chinese Patent Application No. 201880098110.2 dated Apr. 27, 2022.

(Continued)

*Primary Examiner* — Peter Dungba Vo
*Assistant Examiner* — Jose K Abraham
(74) *Attorney, Agent, or Firm* — Pearne & Gordon LLP

(57) ABSTRACT

Disclosed is a mounting substrate manufacturing system including: a component mounting system including: a component mounting device; a housing body stocker that stores a housing body; a component supply device that pulls out a carrier tape from the housing body stored in the housing body stocker and transports the carrier tape to the component mounting device; and a replacement device that includes an end effector for holding the housing body, and replaces the housing body stored in the housing body stocker, wherein the housing body stocker includes at least a pair of partition members that partition a storage space for storing the housing body, at least one of the partition members adjacent to each other includes an assist portion that assists a replacement operation of replacing the housing body, and the replacement device recognizes a position for a replacement operation by bringing the end effector or the housing body held thereby into contact with the assist portion.

16 Claims, 18 Drawing Sheets

(56) References Cited

U.S. PATENT DOCUMENTS

| | | | |
|---|---|---|---|
| 10,462,949 B2* | 10/2019 | Ohashi | H05K 13/0417 |
| 2003/0046808 A1 | 3/2003 | Eskang | |
| 2010/0071200 A1 | 3/2010 | Yonemitsu et al. | |
| 2017/0303448 A1* | 10/2017 | Iisaka | H05K 13/021 |
| 2018/0146581 A1* | 5/2018 | Ohashi | H05K 13/08 |
| 2018/0179017 A1 | 6/2018 | Kobayashi et al. | |
| 2018/0184554 A1* | 6/2018 | Ikeda | H05K 13/02 |
| 2018/0242485 A1* | 8/2018 | Kondo | H05K 13/0478 |
| 2018/0303014 A1* | 10/2018 | Taniguchi | H05K 13/08 |

FOREIGN PATENT DOCUMENTS

| | | | |
|---|---|---|---|
| JP | H04-283035 A | | 10/1992 |
| JP | H05-021990 A | | 1/1993 |
| JP | 3089503 U | | 10/2002 |
| JP | 2004-228207 A | | 8/2004 |
| JP | 2004228207 A | * | 8/2004 |
| JP | 2008-098248 A | | 4/2008 |
| JP | 2017-216379 A | | 12/2017 |
| JP | 2018-152397 A | | 9/2018 |
| WO | 2015/189986 A1 | | 12/2015 |
| WO | 2017/098628 A1 | | 6/2017 |

OTHER PUBLICATIONS

International Search Report issued in Patent Application No. PCT/JP2018/038373 dated Jan. 15, 2019.

* cited by examiner (A)

(B)

MOUNTING SUBSTRATE MANUFACTURING SYSTEM, COMPONENT MOUNTING SYSTEM, AND HOUSING BODY TRANSFER METHOD

CROSS-REFERENCE TO RELATED APPLICATION

The present application is a continuation application of International Application No. PCT/JP2018/038373, filed on Oct. 15, 2018. The contents of these applications are incorporated herein by reference in their entirety.

TECHNICAL FIELD

The present disclosure relates to a mounting substrate manufacturing system and a component mounting system that have the function of automatically replacing a housing body that houses a carrier tape and is stored in a housing body stocker, as well as a housing body transfer method performed when automatically replacing the housing body.

BACKGROUND ART

An automatic replacement device is known that automatically replaces a parts cassette that supplies a component in a mounting substrate manufacturing system (see PTL 1). The parts cassette is formed by integrating a housing body that houses a component with a component supply device. After being caused to wait on a standby stage, the parts cassette is gripped by a robot, and is transferred toward the component mounting device.

CITATION LIST

Patent Literature

[PTL 1] Japanese Laid-Open Patent Publication No. 4-283035

SUMMARY OF INVENTION

Technical Problem

Precise control is necessary to move the parts cassette by the robot to a correct position relative to the component mounting device. In particular, in the case where the housing body that houses a component is separated from the component supply device, unlike the case of the parts cassette, it is difficult to achieve positional alignment between an independent robot and a housing body to be replaced, or positional alignment between a newly supplied housing body held by the robot and the storage space therefor, so that positional displacement is likely to occur, and there is room for improvement in replacing the housing body without delay.

In order to automatically supply a component to the component mounting device by a replacement device or a robot, it is necessary that the robot is capable of picking up a used housing body from a specific storage space in a housing body stocker attached to the component mounting device, and supplying a new housing body to that storage space. However, there are individual differences in the size and the shape of between housing bodies even for the same housing body, and, moreover, the state of installation of the housing body in the storage space often varies. Accordingly, difficulties are encountered in stably handling the housing body by the replacement device. For example, when the housing body is to be gripped by an end effector of the replacement device, it is difficult to achieve positional alignment between the end effector and the housing body if the housing body is even slightly inclined in the storage space.

Increasing the size of the storage space can make insertion of a new housing body into the storage space relatively easy; however, this reduces the number of housing bodies stored by the housing body stocker, resulting a reduction in the productivity of the mounting substrate. It is considered that the width of the storage space is preferably slightly larger than a total dimension of the width of the housing body and the width of the end effector.

In view of the foregoing, it is an object of the present disclosure to facilitate the automatic replacement of a housing body.

Solution to Problem

An aspect of the present disclosure relates to a mounting substrate manufacturing system including: a component mounting system including: a component mounting device that picks a component from a carrier tape and mounts the component on a substrate; a housing body stocker that stores a housing body that houses the carrier tape; and a component supply device that pulls out the carrier tape from the housing body stored in the housing body stocker and transports the carrier tape to the component mounting device; and a replacement device that includes an end effector for holding the housing body, and replaces the housing body stored in the housing body stocker, wherein the housing body stocker includes at least a pair of partition members that partition a storage space for storing the housing body, and at least one of the partition members adjacent to each other includes an assist portion that assists a replacement operation of replacing the housing body.

Another aspect of the present disclosure relates to a component mounting system including: a component mounting device that picks a component from a carrier tape and mounts the component on a substrate; a housing body stocker that stores a housing body that houses the carrier tape; and a component supply device that pulls out the carrier tape from the housing body stored in the housing body stocker and transports the carrier tape to the component mounting device, wherein the housing body stocker includes at least a pair of partition members that partition a storage space for storing the housing body, and at least one of the partition members adjacent to each other includes an assist portion that assists a replacement operation in which a replacement device including an end effector for holding the housing body replaces the housing body stored in the housing body stocker.

Yet another aspect of the present disclosure relates to a housing body transfer method performed, in a component mounting system including: a component mounting device that picks a component from a carrier tape and mounts the component on a substrate; a housing body stocker that stores a housing body that houses the carrier tape; and a component supply device that pulls out the carrier tape from the housing body mounted in the housing body stocker and transports the carrier tape to the component mounting device, when picking up the housing body stored in the housing body stocker by a replacement device including an end effector for holding the housing body, wherein the housing body stocker includes at least a pair of partition members that partition a storage space for storing the housing body, and at least one of the partition members adjacent to each other includes an assist portion that assists a replacement operation of replacing the housing body, the method including the steps of: bringing the end effector in a state before picking up the housing body stored in the storage space, into contact with the assist portion; moving, in a state in which the end effector is in contact with the assist portion, the end effector to a position for holding the end effector; and holding the housing body by the end effector, and moving the housing body to outside of the storage space, thus picking up the housing body.

Still another aspect of the present disclosure relates to a housing body transfer method performed, in a component mounting system including: a component mounting device that picks a component from a carrier tape and mounts the component on a substrate; a housing body stocker that stores a housing body that houses the carrier tape; and a component supply device that pulls out the carrier tape from the housing body mounted in the housing body stocker and transports the carrier tape to the component mounting device, when storing the housing body in the housing body stocker by a replacement device including an end effector for holding the housing body, wherein the housing body stocker includes at least a pair of partition members that partition a storage space for storing the housing body, and at least one of the partition members adjacent to each other includes an assist portion that assists a replacement operation of replacing the housing body, the method including the steps of: bringing the housing body held by the end effector into contact with the assist portion; moving, in a state in which the housing body is in contact with the assist portion, the end effector to a position for releasing holding of the housing body; and releasing holding of the housing body by the end effector, thus storing the housing body in the storage space.

Advantageous Effects of Invention

According to the present invention, the automatic replacement of a housing body is facilitated in a mounting substrate manufacturing system and a component mounting system that have the function of automatically replacing a housing body that houses a carrier tape and being stored in a housing body stocker.

DESCRIPTION OF EMBODIMENTS

Figure 1:
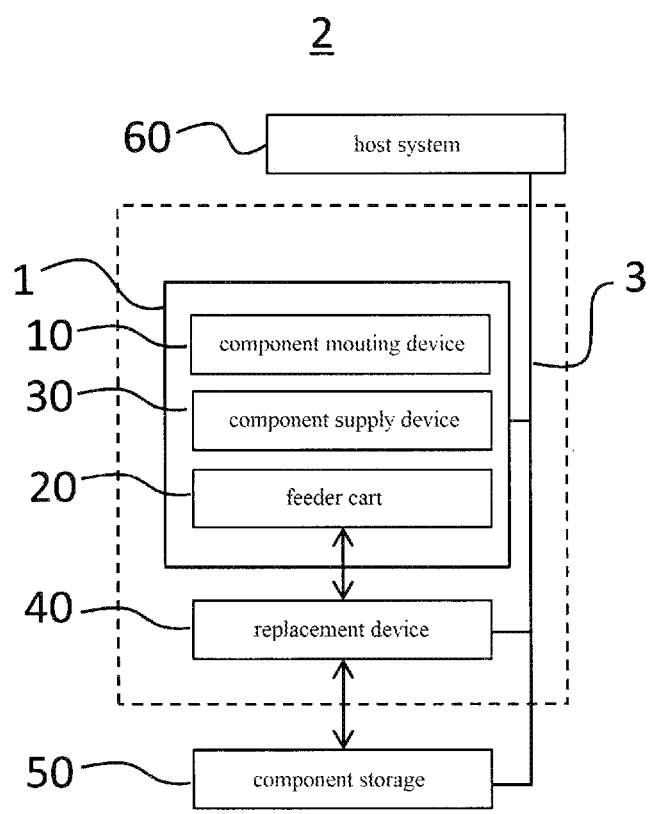
FIG. 1 is a block diagram showing a schematic configuration of a mounting substrate manufacturing system according to an embodiment of the present invention.

A component mounting system according to an embodiment of the present disclosure includes: a component mounting device that picks a component from a carrier tape and mounts the component on a substrate; a housing body stocker that stores a housing body that houses the carrier tape; and a component supply device that pulls out the carrier tape from the housing body stored in the housing body stocker and transports the carrier tape to the component mounting device. A mounting substrate manufacturing system according to an embodiment of the present disclosure includes, in addition to the component mounting system, a replacement device that includes an end effector for holding the housing body, and replaces the housing body stored in the housing body stocker.

The housing body stocker includes at least a pair of partition members that partition a storage space for storing the housing body. At least one of the partition members adjacent to each other includes an assist portion that assists a replacement operation of replacing the housing body. The assist portion assists the entry of a distal end of the end effector between the housing body and the partition members when the end effector picks up the housing body stored in the storage space. The assist portion assists the entry of the housing body into a desired storage space when storing the housing body held by the end effector in the storage space. The partition members including the assist portion define a storage space for which the replacement operation is to be performed. At this time, the end effector or the housing body held by the end effector can move along the assist portion or the partition members, so that the placement of the housing body into and out of the storage space can be easily performed.

In the case of bringing the end effector or the housing body held by the end effector into contact with the assist portion, for example, the replacement device first brings the end effector or the housing body held by the end effector adjacent to the assist portion. Specifically, a part of the end effector or the housing body is inserted between a pair of partition members including the partition members that define a storage space for which replacement is to be performed. Thereafter, the end effector or the housing body is moved in the thickness direction of the partition members, whereby the end effector or the housing body comes into contact with the assist portion from the lateral side. In this case, the assist portion may be a side surface of the partition members that faces the storage space.

The partition members may be elastically deformed in a thickness direction thereof by an external force generated when the partition members come into contact with the end effector or the housing body held by the end effector. Since the partition members are easily elastically deformed, the storage space can be temporarily expanded by the end effector or the housing body held thereby. Accordingly, the placement of the housing body into and out of the storage space is facilitated. In particular, by elastically deforming the partition members in the thickness direction, a gap for allowing the entry of the end effector can be easily secured between the partition members and the housing body.

The housing body stocker may include a plurality of aligned pairs of the partition members, and, usually, ten or more storage spaces are provided in alignment. In this case, the partition members including the assist portion may be alternately disposed. In other words, when the end effector or the housing body held thereby comes into contact with one assist portion of the partition members, the partition member adjacent to the partition member including that assist portion does not come into contact with the end effector or the housing body held thereby. In this case, a spatial allowance is created around the target assist portion, so that the end effector or the housing body held thereby can easily access the assist portion even if the interval between the partition members is narrowed.

The assist portion may have an area that is not shielded by the housing body stored in the storage space. For example, the dimension of the partition member in a predetermined direction may be sufficiently larger than the dimension of the housing body. In other words, a part of the partition member may be caused to protrude from the housing body when the housing body is stored in the storage space, and the protruding part may be used as the assist portion. Accordingly the end effector or the housing body held thereby can even more easily access the assist portion, and the end effector or the housing body can be more easily placed into and out of the storage space along the assist portion or the partition members.

The end effector may include a pair of gripping portions that grip the housing body. In this case, at least one of the gripping portions may be brought into contact with the assist portion.

The housing body stored in the storage space may be positioned such that a gap is formed between the housing body and each of the partition members. By forming a gap between the partition members and the housing body, the end effector can be easily caused to enter between a used housing body and the partition members when the housing body is picked up from the storage space.

The housing body stocker may include a gap-forming portion that forms a gap between the housing body stored in the storage space and each of the partition members. In the case where the housing body stocker includes a supporting member that supports the housing body in the storage space, the gap-forming portion may be formed on the supporting member. At least one gap-forming portion including the supporting member may be provided for each storage space, or a plurality of the gap-forming portions may be provided for each storage space. The supporting member may be interposed between a pair of partition members. The gap-forming portion may have the function of positioning the housing body in the storage space.

The gap-forming portion may be an inclined surface descending in a direction away from the partition member. As a result of the housing body housed in the storage space sliding on the inclined surface by its own weight, the housing body moves away from the partition member, whereby a gap is formed between each of the partition members and the housing body. Alternatively, the gap-forming portion may be a protrusion protruding into the storage space from the central portion of the supporting member. By positioning the housing body at the center of the storage space by such a protrusion, a gap can be secured between the housing body and each of the partition members.

A housing body transfer method according to an embodiment of the present disclosure is a housing body transfer method performed, in the above-described component mounting system, when picking up the housing body stored in the housing body stocker by the above-described replacement device, the method including the steps of: (A-i) bringing the end effector in a state before picking up the housing body stored in the storage space, into contact with the assist portion, thus positioning the end effector relative to the storage space; (A-ii) moving, in a state in which the end effector is in contact with the assist portion, the end effector to a position for holding the housing body; and (A-iii) holding the housing body by the end effector, and moving the housing body to the outside of the storage space, thus picking up the housing body. In step (A-i), the replacement device, for example, detects a contact with the assist portion, and recognizes a position at which an operation of picking up the housing body from the storage space is to be performed. In step (A-ii), the end effector moves in the storage space along the assist portion or the partition members. In step (A-iii), the end effector holds the housing body at an accurate position.

A housing body transfer method according to another embodiment of the present disclosure is a housing body transfer method performed, in the above-described component mounting system, when storing the housing body in the housing body stocker by the above-described replacement device, the method including the steps of: (B-i) bringing the housing body held by the end effector into contact with the assist portion, thus positioning the end effector relative to the storage space; (B-u) moving, in a state in which the housing body is in contact with the assist portion, the end effector from the positioned state to a position for releasing holding of the housing body; and (B-iii) releasing holding of the housing body by the end effector, thus storing the housing body in the storage space, and thereafter moving the end effector. In step (B-i), the replacement device, for example, detects that the housing body has come into contact with the assist portion, and recognizes a position at which an operation of inserting the housing body into the storage space is to be performed. In step (B-ii), the housing body moves in the storage space along the access portion or the partition member. In step (B-iii), the end effector releases holding of the housing body at an accurate position.

In steps (A-i) and (B-i), the end effector or the housing body held thereby may be brought adjacent to the assist portion, and may thereafter be moved in the thickness direction of the partition members. The partition members may be elastically deformed in the thickness direction thereof by an external force generated when the end effector or the housing body is brought into contact with the partition members.

Hereinafter, embodiments of systems and methods according to the present disclosure will be described with reference to the accompanying drawings. In the description of the embodiments, terms (e.g., "up and down", "left and right", "front and rear", "X, Y, and Z", etc.) that are used to indicate directions in order to facilitate the understanding are merely illustrative, and these terms are not intended to limit the present invention. In the drawings, constituent parts are illustrated in relative dimensions in order to clarify the shape and the characteristics thereof, and are not necessarily shown with the same scale ratio. In the drawings, similar constituent parts are referenced with similar reference numerals.

[1. Overall Configuration of Mounting Substrate Manufacturing System]

An overall configuration of a mounting substrate manufacturing system 2 will be schematically described with reference to FIGS. 1 to 3. The mounting substrate manufacturing system 2 has the function of manufacturing a mounting substrate by mounting a component on a substrate.

FIG. 1 is a block diagram showing a schematic configuration of the mounting substrate manufacturing system 2. The mounting substrate manufacturing system 2 includes a component mounting system 1, and a replacement device 40 that replaces a housing body stored in a feeder cart 20. The elements constituting the mounting substrate manufacturing system 2 are connected to each other via a wired or wireless communication network 3, as needed, and are managed by a host system 60. The host system 60 includes, for example, a management computer, a human machine interface (HMI), various control units, a storage device, and so forth that communicate with the elements constituting the mounting substrate manufacturing system 2.

Figure 2:
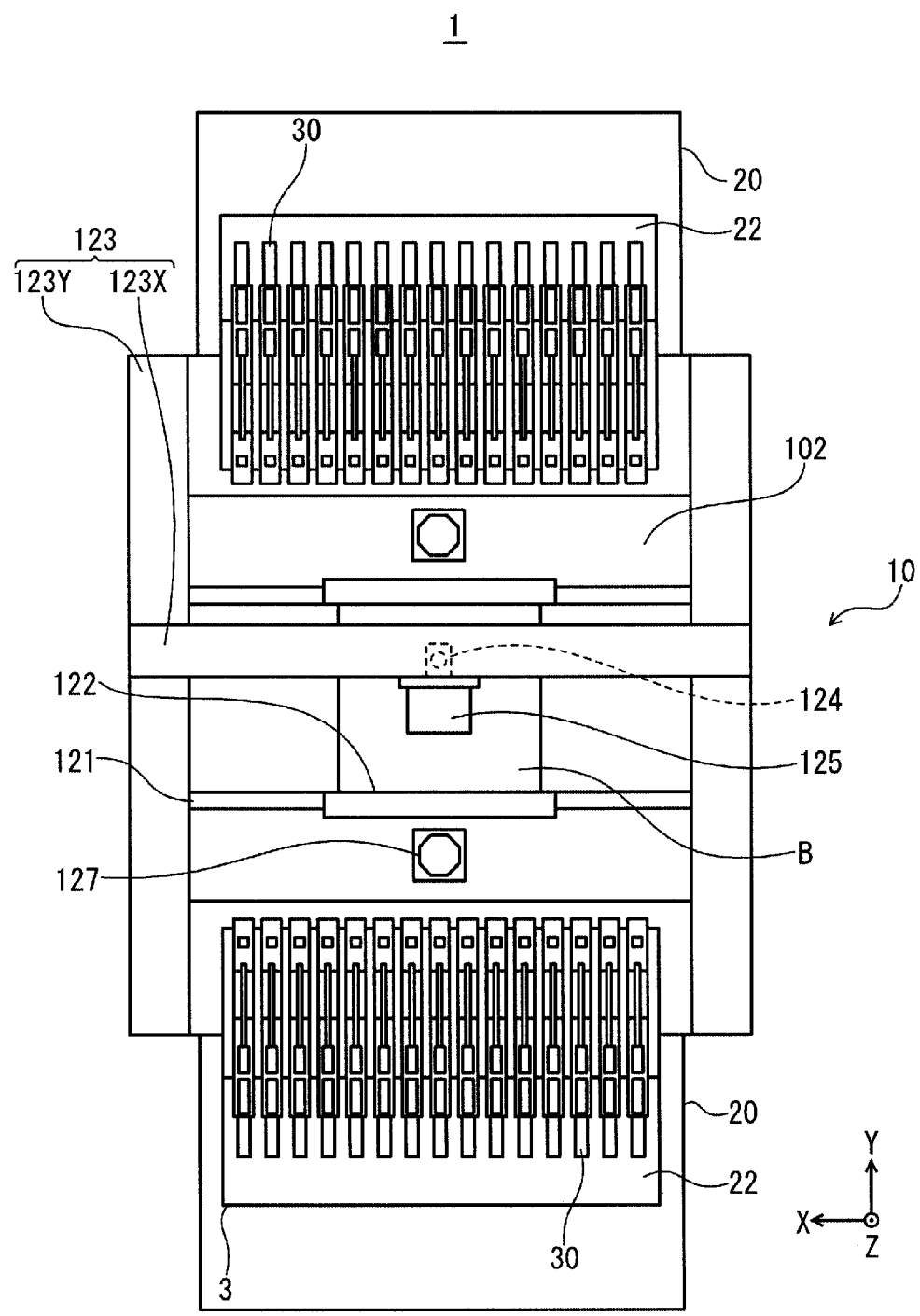
FIG. 2 is a plan view of a component mounting system according to an embodiment of the present invention, as viewed from above.

FIG. 2 is a plan view of the component mounting system 1 included in the mounting substrate manufacturing system 2, as viewed from above. FIG. 3 is a side view of the component mounting system 1 as viewed in the X direction in FIG. 2 (hereinafter, the direction is also based on FIG. 2). The component mounting system 1 includes a component mounting device (e.g., chip mounter) 10 that picks a component from a carrier tape and mounts the component on a substrate, a feeder cart 20 that stores a housing body (e.g., a reel) that houses the carrier tape, and a component supply device (e.g., a tape feeder) 30 that pulls out the carrier tape from the housing body stored in the feeder cart 20 and transports the carrier tape to the component mounting device 10. The component supply device 30 is connected to the component mounting device 10 in a state in which the component supply device 30 is loaded on the feeder cart 20.

Note that the mounting substrate manufacturing system 2 may include a line formed by coupling a plurality of component mounting systems 1, and may have a plurality of such lines.

[1-1. Configuration of Component Mounting Device]

Figure 3:
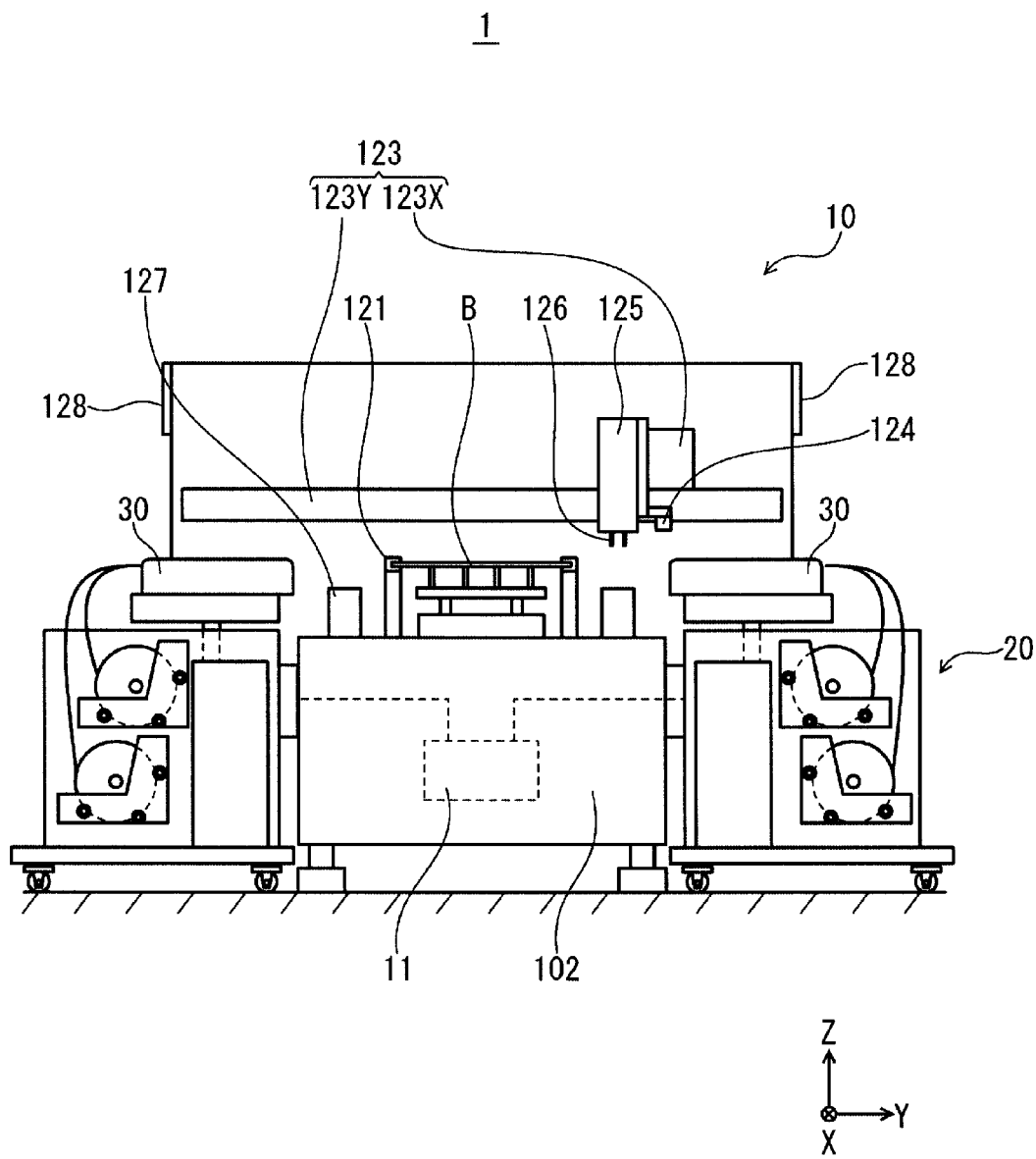
FIG. 3 is a side view of the component mounting system as viewed from the X direction in FIG. 2 (hereinafter, the direction is also based on FIG. 2).

With reference to FIGS. 2 and 3, the component mounting device 10 will be specifically described. The component mounting device 10 includes a base 102, and a system control unit 11 that is incorporated in the base 102. The system control unit 11 governs the overall control of the component mounting system 1. The system control unit 11 may be connected to a human machine interface (HMI) 128 such as a touch panel. A machine operator can input, for example, information regarding the settings and the like of the component mounting system 1 via the HMI 128. A substrate transport conveyor 121 is provided on the base 102 and transports a substrate B in the X direction. A substrate positioning portion 122 holds the substrate B at a predetermined mounting work position of the substrate transport conveyor 121.

A head movement mechanism 123 is provided on the base 102. The head movement mechanism 123 includes a pair of Y-axis tables 123Y, and an X-axis table 123X that is horizontally disposed on the Y-axis tables 123Y. Each of the tables 123X and 123Y includes a linear drive mechanism.

A head camera 124 and a mounting head 125 are mounted to the X-axis table 123X so as to be movable in the X direction. The X-axis table 123X moves the head camera 124 and the mounting head 125 in the X direction by driving the linear drive mechanism incorporated therein, and causes the head camera 124 and the mounting head 125 to stop at a designated position. The Y-axis tables 123Y move the X-axis table 123X in the Y direction by driving the linear drive mechanisms incorporated therein, and cause the X-axis table 123X to stop at a designated position. Accordingly, the head camera 124 and the mounting head 125 are moved in the horizontal direction toward a given position by the X-axis table 123X and the Y-axis tables 123Y. The head camera 124 captures an image of a recognition mark for positioning the substrate B. The captured image of the recognition mark is sent to the system control unit 11, and the system control unit 11 recognizes the position of the recognition mark, that is, the position of the substrate B. The mounting head 125 includes a component holding nozzle 126 that holds the component C by negative pressure. The mounting head 125 incorporates therein a nozzle elevation mechanism for raising and lowering the component holding nozzle 126, a nozzle rotating mechanism for rotating the component holding nozzle 126 about a vertical axis, and a valve mechanism for exerting the negative pressure for holding the component on the component holding nozzle 126. Accordingly, the component holding nozzle 126 can vacuum-suck the component C located at a component pick-up position of the component supply device 30, and release the component at a predetermined position of the substrate B, thus mounting the component on the substrate B.

A component recognition camera 127 is disposed between the component supply device 30 and the substrate transport conveyor 121. The component recognition camera 127 captures an image of the component C held by the component holding nozzle 126, and sends the image to the system control unit 11. The system control unit 11 recognizes the position and the orientation of the component held by the component holding nozzle 126.

Based on a recognition result of the position of the substrate B, a recognition result of the component, and so forth, the system control unit 11 controls the X-axis table 123X and the Y-axis tables 123Y, as well as the nozzle rotating mechanism. This allows the component to be accurately positioned at a predetermined position of the substrate B.

[1-2. Configuration of Component Supply Device]

Figure 4:
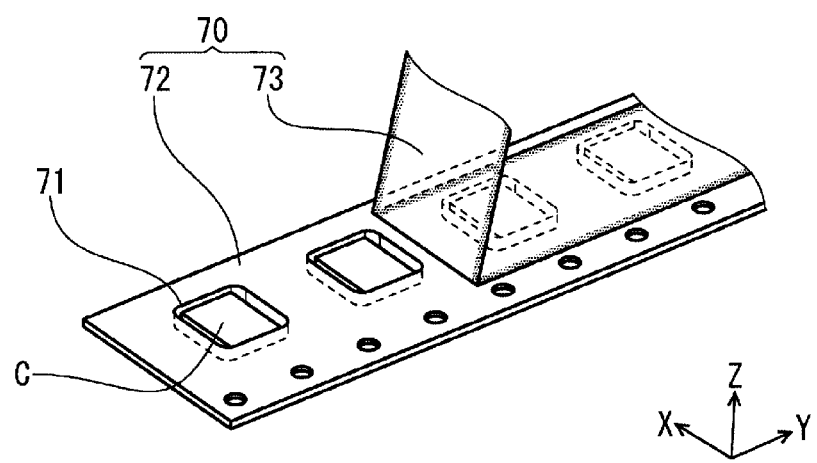
FIG. 4 is a perspective view showing an example of a carrier tape.

The component supply device 30 pulls out, from the housing body 5, a carrier tape 70 carrying a plurality of components C, and transports the components C to the component pick-up position. FIG. 4 is a perspective view showing an example of the carrier tape 70 carrying a plurality of components C. The carrier tape 70 includes a tape main body 72 including recess-shaped component accommodating portions 71, and a top tape 73 attached so as to cover the component accommodating portions 71 accommodating the components C. The component supply device 30 pulls out the carrier tape 70 from the housing body 5 held by the housing body stocker 21, also peels off or cuts open the top tape 73 to expose the component C, and causes the component C to be located at the component pick-up position.

Figure 5:
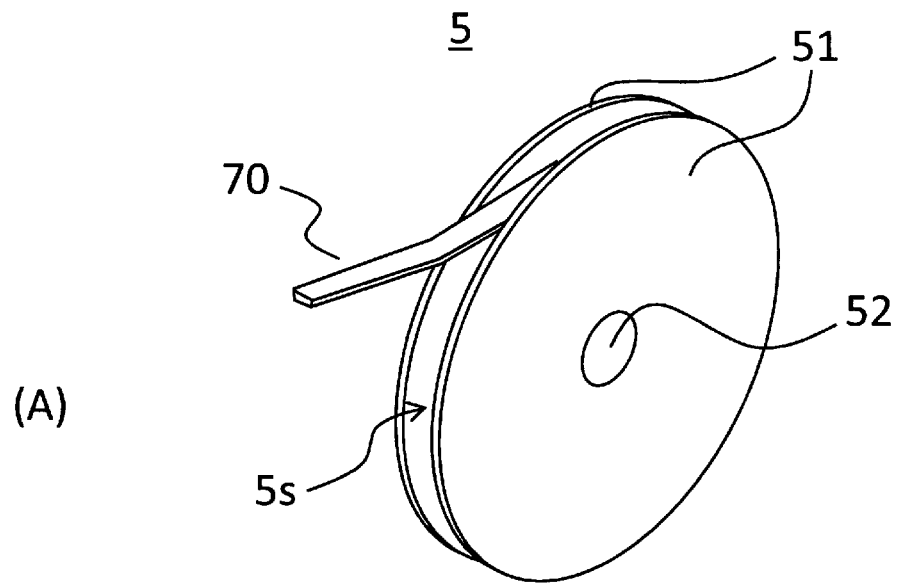
FIG. 5 shows perspective views of a reel (A) and a box-shaped case (B), each serving as a housing body that houses the carrier tape.
Figure 5:
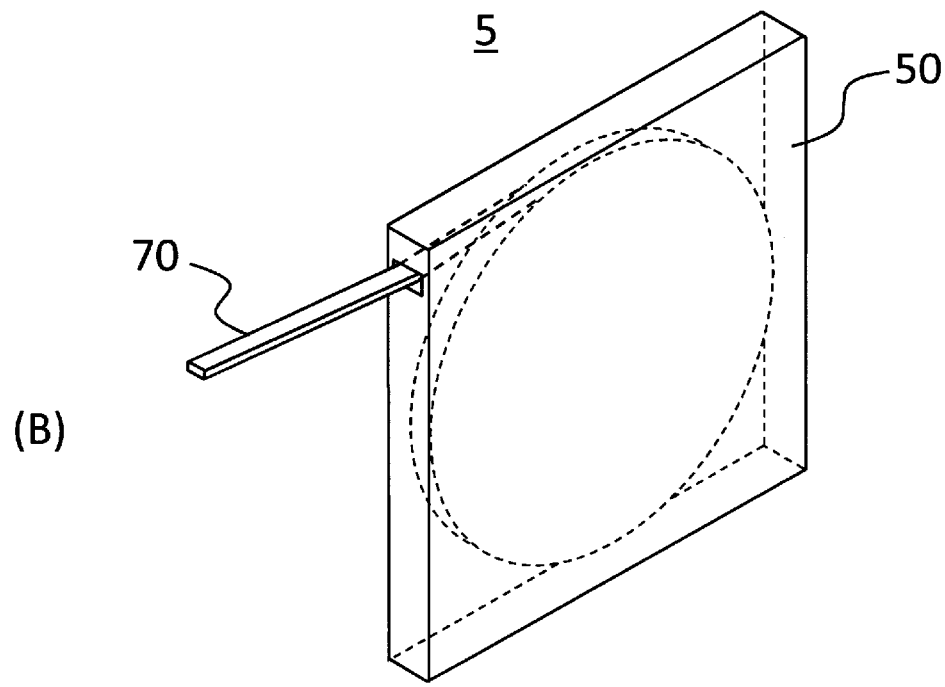

The carrier tape 70 may be housed in various housing bodies 5. FIG. 5 shows perspective views of a reel (A) and a box-shaped case (B) as examples of the housing body. The reel (housing body) 5 has, for example, a structure in which a pair of disk-shaped members 51 are coupled at the central portions thereof. A tape housing gap 5s having a width substantially equivalent to the width of the carrier tape 70 is formed between the pair of disk-shaped members 51. A carrier tape 70 is housed in the tape housing gap 5s by being wound around a central core portion 52 of the reel (housing body) 5. On the other hand, the box-shaped case (housing body) 5 may have a hollow portion surrounded by a wall portion 50 formed of a sheet-like material, for example, and a spirally wound carrier tape 70 is accommodated in the hollow portion.

The housing body 5 may be provided with a housing body identification mark. The housing body identification mark may include a bar code, a two-dimensional code, and the like on which information identifying the housing body 5 is recorded. The component supply device 30 may be provided with a supply device identification mark. The supply device identification mark may include a bar code, a two-dimensional code, and the like on which information identifying the component supply device 30 is recorded.

[1-3. Configuration of Feeder Cart]

Figure 6:
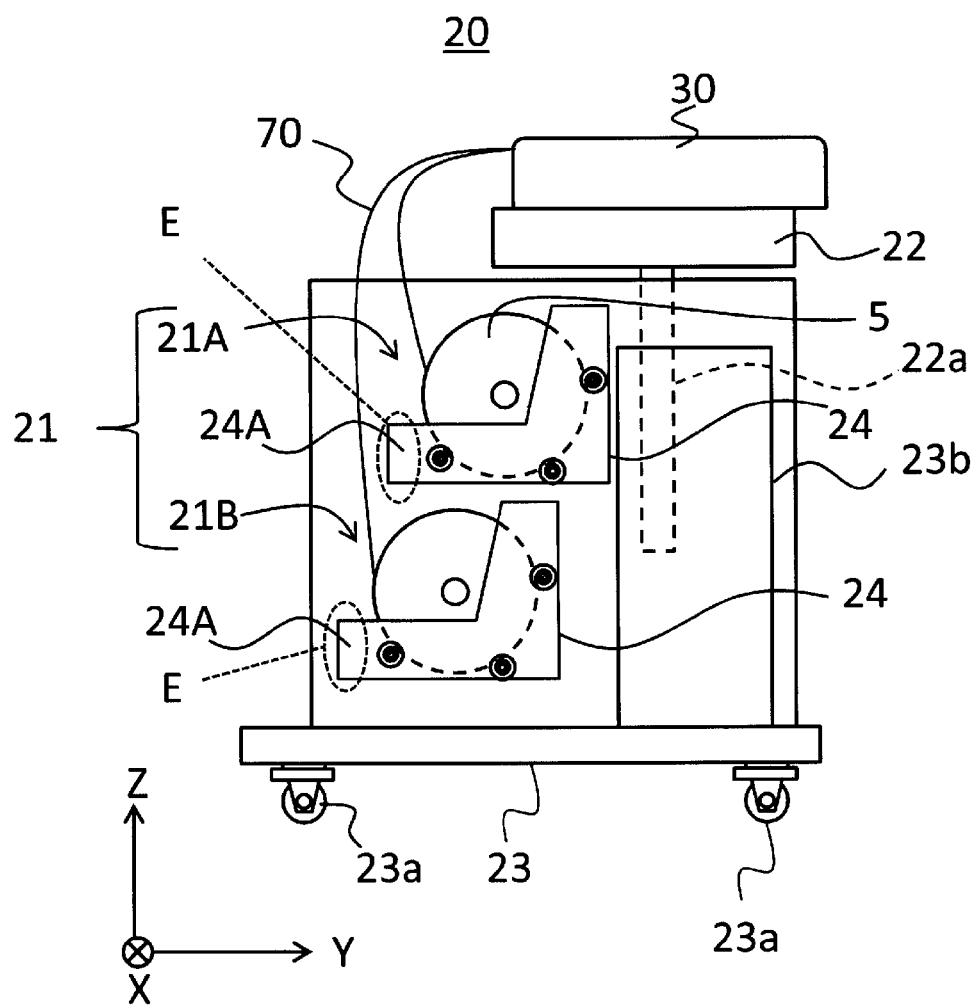
FIG. 6 is a cross-sectional view of a housing body stocker as viewed in the X direction.
Figure 7:
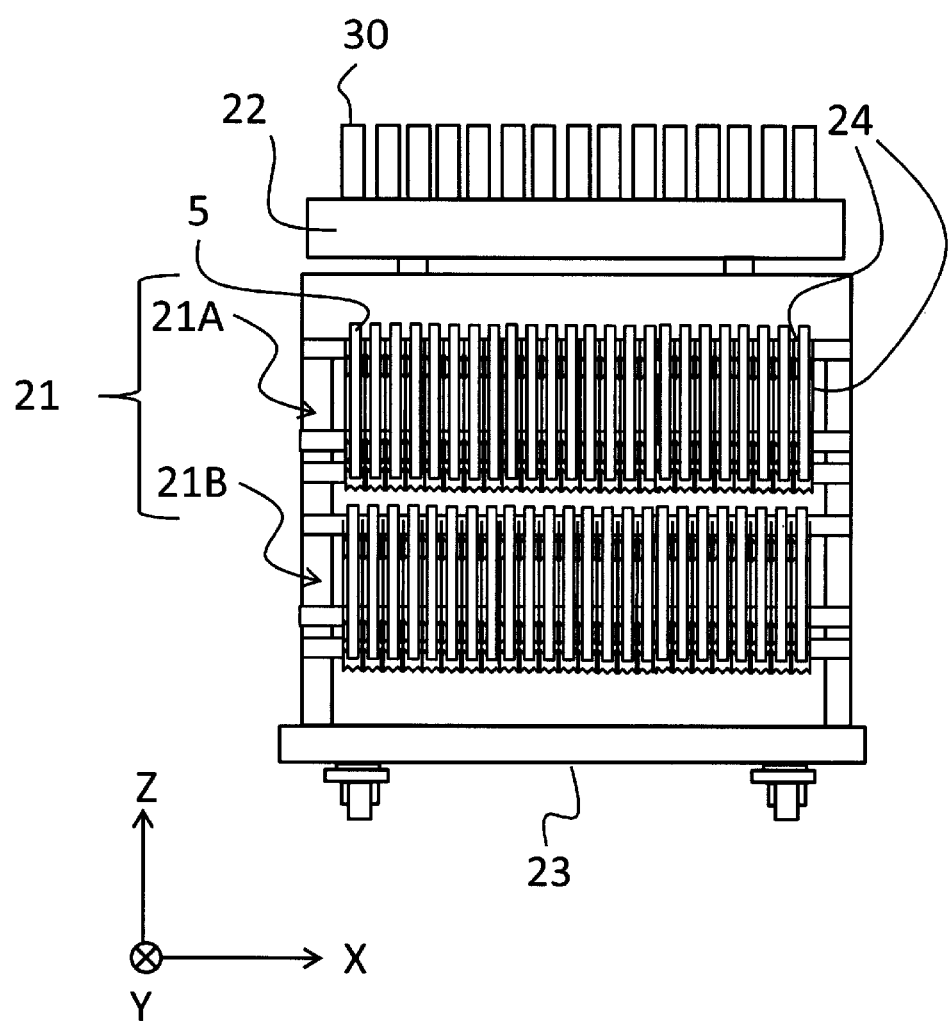
FIG. 7 is a front view of the housing body stocker as viewed in the Y direction.

FIG. 6 is a cross-sectional view of the feeder cart 20 as viewed in the X direction. FIG. 7 is a front view of the feeder cart 20 as viewed in the Y direction. The feeder cart 20 includes a housing body stocker 21, a feeder mounting portion 22 disposed above the housing body stocker 21, and a carriage portion 23 including wheels 23a. Additionally, the feeder cart 20 includes a supporting base 23b that supports the feeder mounting portion 22. The housing body stocker 21 includes an upper stocker 21A disposed below the feeder mounting portion 22, and a lower stocker 21B disposed below the upper stocker 21A. A plurality of component supply devices (tape feeders) 30 are placed on an upper surface of the feeder mounting portion 22 so as to be arranged in the X direction.

The feeder mounting portion 22 includes a supporting post 22a on the lower surface thereof, and the supporting post 22a is mounted so as to be displaceable in the vertical and horizontal directions relative to the supporting base 23b. That is, the feeder mounting portion 22 is mounted so as to be displaceable in the vertical and horizontal directions relative to the carriage portion 23. The feeder mounting portion 22 is positioned relative to the base 102 so as to be separated from the carriage portion 23 when the feeder mounting portion 22 is mounted to the base 102 of the component mounting device 10. The component supply device 30 is configured to be communicable with the system control unit 11 of the component mounting device 10 when the feeder mounting portion 22 is mounted to the base 102 of the component mounting device 10. The system control unit 11 transmits, to the component supply device 30, a command to supply the component C, to cause the component supply device 30 to supply the component C to the component pick-up position.

The feeder cart 20 may be provided with a carriage unit identification mark. The carriage unit identification mark may include a bar code, a two-dimensional code, and the like on which information identifying the feeder cart 20 is recorded. A plurality of storage spaces S and/or the feeder mounting portion 22 may be provided with a position identification mark. The position identification mark may include a bar code, a two-dimensional code, and the like on which information identifying a storage space S where the housing body 5 is to be recovered or supplied, or the feeder mounting portion 22.

Figure 8:
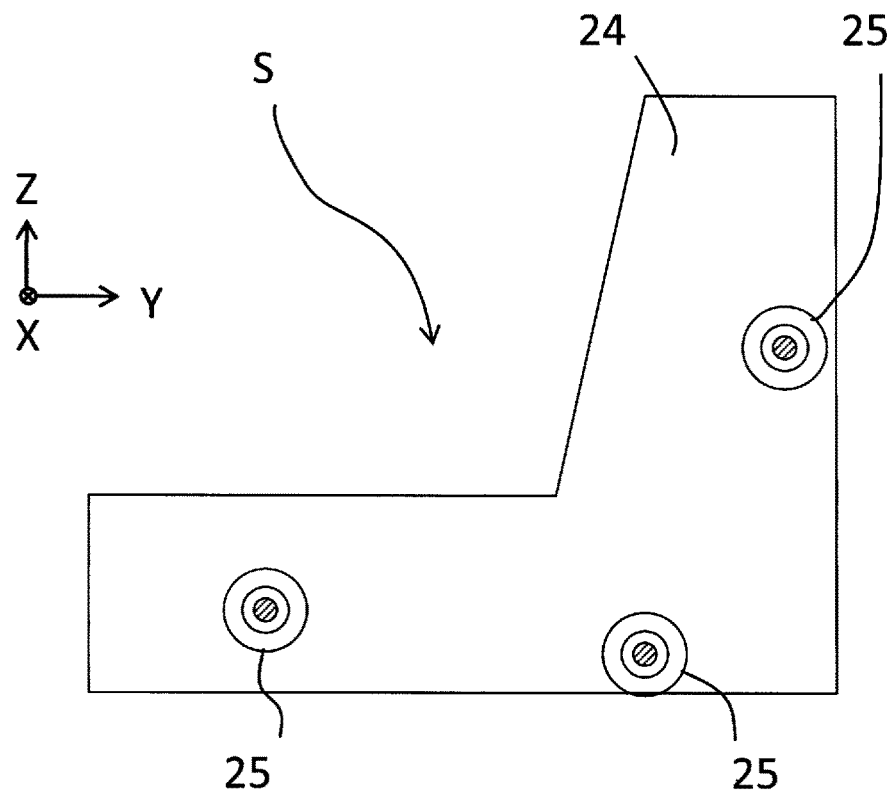
FIG. 8 is a side view of relevant portions of the housing body stocker in which no housing body is stored, as viewed from the X direction.
Figure 9:
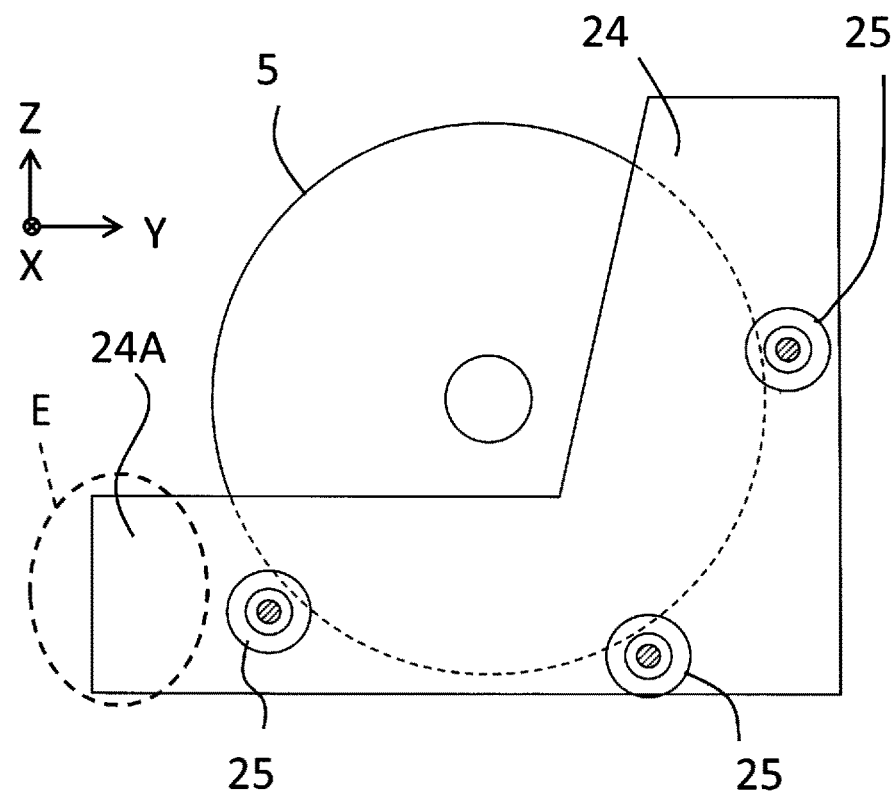
FIG. 9 is a side view of relevant portions of the housing body stocker in which housing bodies are stored, as viewed in the X direction.
Figure 10:
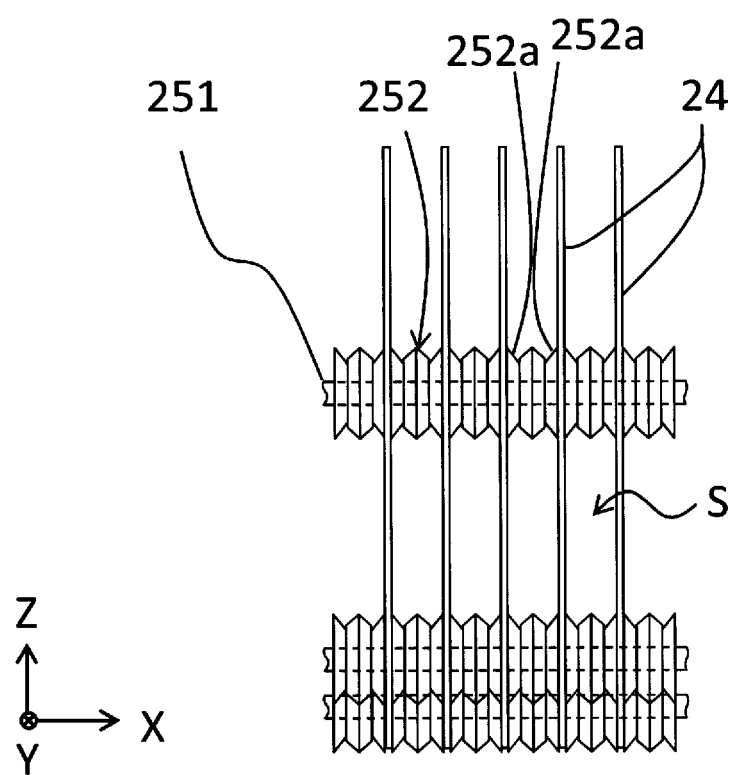
FIG. 10 is a front view of relevant portions of the housing body stocker in which no housing body is stored, as viewed in the Y direction.
Figure 11:
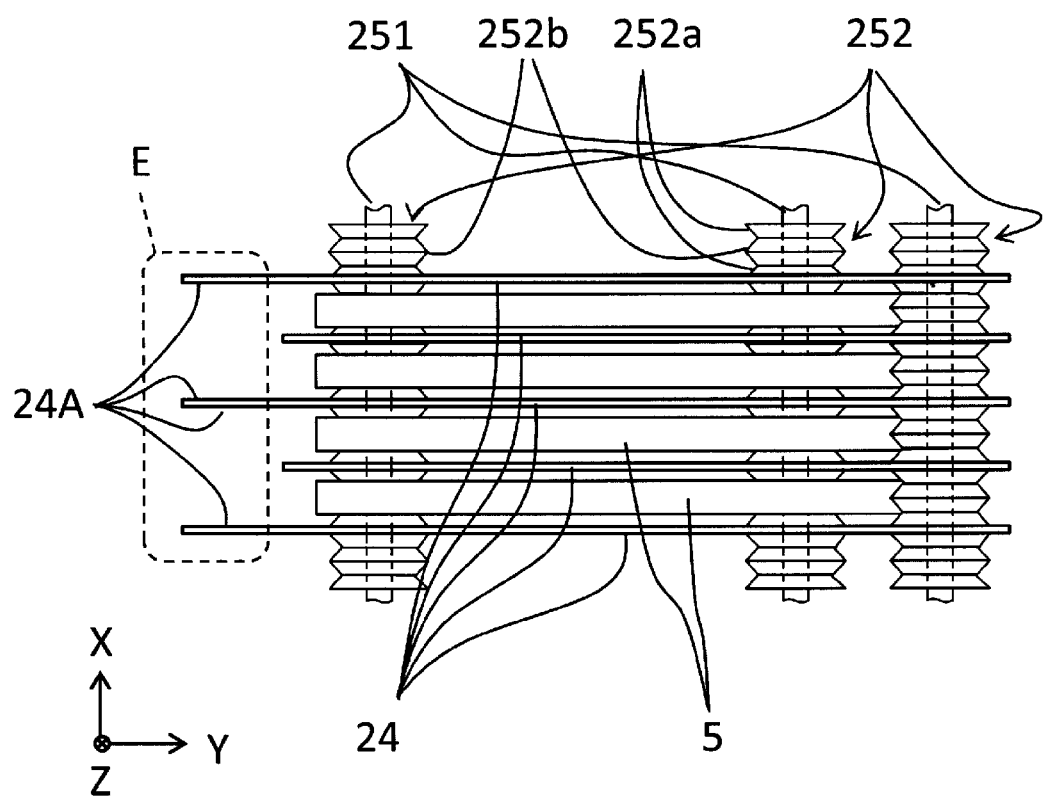
FIG. 11 is a top view of relevant portions of the housing body stocker in which housing bodies are stored, as viewed in the Z direction.

FIG. 8 shows a side view of relevant portions of the housing body stocker 21 when no housing body 5 is housed therein, as viewed in the X direction. On the other hand, FIG. 9 shows a side view of relevant portions of the housing body stocker 21 when housing bodies 5 are housed therein, as viewed in the X direction. FIG. 10 shows a front view of relevant portions of the housing body stocker 21 when no housing body is stored therein, as viewed in the Y direction. On the other hand, FIG. 11 shows a top view of relevant portions of the housing body stocker 21 when housing bodies 5 are housed therein, as viewed in the Z direction. Each of the stockers 21A and 21B has a plurality of storage spaces S arranged in the X direction so as to be able to accommodate a plurality of housing bodies 5. Each of the plurality of storage spaces S is partitioned by a pair of partition members 24.

Each partition member 24 is formed by a substantially plate-shaped member. Preferably, the partition member 24 is formed by a member capable of being elastically deformed in the thickness direction by external force. For example, it is possible to use a metal plate, a resin plate, and the like. Among these, a plate material made of stainless steel is preferable in that it has a suitable degree of elasticity.

As shown in FIG. 9, in a state in which the housing bodies 5 are stored, each partition member 24 has areas that are not shielded by the housing body 5 (an area that does not overlap the housing body 5). Of the areas of the partition member 24 that are not shielded by the housing body 5, an area that can be easily accessed by the replacement device 40 or the housing body 5 held thereby can be used as an assist portion 24A that assists a replacement operation of replacing the housing body 5. The replacement device 40 or the housing body 5 held thereby can easily access a region including a distal end of the partition member 24 on the front side (the region encircled by the dashed line E in FIGS. 6 and 9). Accordingly, the aforementioned region (in particular, a side surface thereof that faces the storage space S) can function as the assist portion 24A. Note that the replacement operation using the assist portion 24A will be described later.

As shown in FIG. 11, the partition members 24 including the assist portion 24A (the region encircled by the dashed line E) are alternately disposed. In this case, the interval between a pair of the partition members 24 including the assist portion is sufficiently larger than the width of two housing bodies 5. Accordingly, a spatial allowance is created around the target assist portion 24A, so that the replacement device 40 or the housing body 5 held thereby can easily access the assist portion 24A.

As shown in FIGS. 8 to 11, the plurality of partition members 24 are coupled to each other, for example, by a rod-shaped coupling member 25. Although the coupling members 25 are provided at three locations in the illustrated example, the number of coupling members 25 is not particularly limited. Here, each coupling member 25 is composed of a rod main body 251 disposed with the axial direction thereof oriented in the X direction, and a plurality of annular supporting members 252 into which the rod main body 251 is inserted. Each of the supporting members 252 is mounted to the coupling member 25 so as to be sandwiched between adjacent partition members 24, and functions as a width determining member that determines the interval between adjacent partition members 24, that is, the width of the storage space S. The width of each of the supporting members 252 is greater than or equal to a total dimension of the width of the housing body 5 and the thickness of the end effector. Accordingly, the width of the storage space S is greater than or equal to the width of the housing body 5 and the thickness of the end effector. Each of the supporting members 252 functions as a supporting portion that supports the housing body 5. Although the supporting members 252 may be provided for at least one coupling member 25, they may be provided for a plurality of coupling members 25.

The supporting members 252 may also have the function of positioning the partition members 24 to the rod main body 251. In the illustrated example, each of the plurality of supporting members 252 is interposed between a pair of partition members 24. That is, the width of each of the plurality of supporting members 252 corresponds to the width of the storage space S. A small gap having a slit shape is present between adjacent supporting members 252, and a partition member 24 is sandwiched in the gap, and is thus fixed at a predetermined position of the rod main body 251.

Each of the supporting members 252 may further have the function of positioning the housing body 5 such that a gap is formed between the housing body 5 and the assist portion 24A in the storage space S. For example, as shown in FIG. 10, each supporting member 252 may be provided with gap-forming portions 252a in proximity to the partition members 24. Here, the gap-forming portions 252a are inclined surfaces descending in a direction away from the partition members 24, and the housing body 5 slides on the inclined surface by its own weight when placed on the supporting member 252, and is thus positioned. As stated previously, the gap between the partition member 24 and the housing body 5 facilitates the replacement of the housing body 5 in the storage space S.

In the case where the housing body 5 is the reel (housing body) 5 in which a pair of disk-shaped members are coupled at the central portions thereof, a tape housing gap 5s is formed between the pair of disk-shaped members 51. By providing each of the supporting members 252 with a protrusion 252b that can enter the tape housing gap 5s, it is possible to allow the supporting member 252 to position the reel (housing body) 5. This facilitates more accurate positioning of the reel (housing body) 5 in the storage space S. However, the reel (housing body) 5 is in the state of being rotatable as the carrier tape 70 is transported, and has a suitable degree of freedom.

Figure 12:
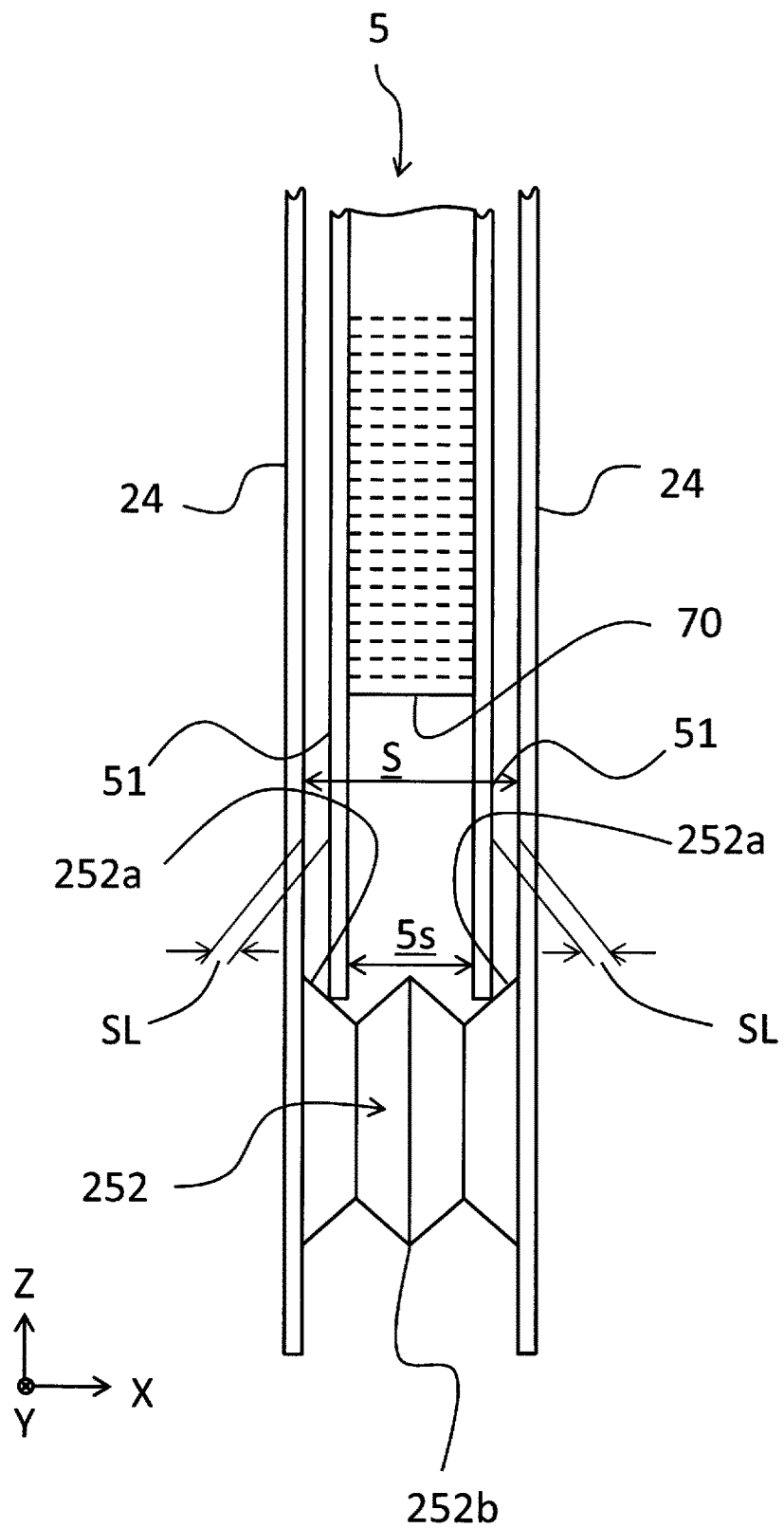
FIG. 12 is an enlarged front view of relevant portions of the housing body stocker in which a housing body is stored, as viewed in the Y direction.

FIG. 12 is an enlarged front view of relevant portions of a housing body stocker according to an embodiment in which a reel (housing body) 5 is stored, as viewed in the Y direction. The reel (housing body) 5 includes a pair of disk-shaped members 51, and a tape housing gap 5s is formed between the pair of disk-shaped members 51. The supporting member 252 has inclined surfaces descending in a direction away from the partition members 24 as the gap-forming portions 252a, and includes a protrusion 252b that can enter the tape housing gap 5s. In this manner, since the storage space S or the supporting member 252 includes the gap-forming portions 252a and the protrusion 252b, a gap SL can be easily formed between each of the partition members 24 and the housing body 5, and the reel (housing body) 5 can be more reliably positioned at a position where the gaps SL can be formed.

Figure 13A:
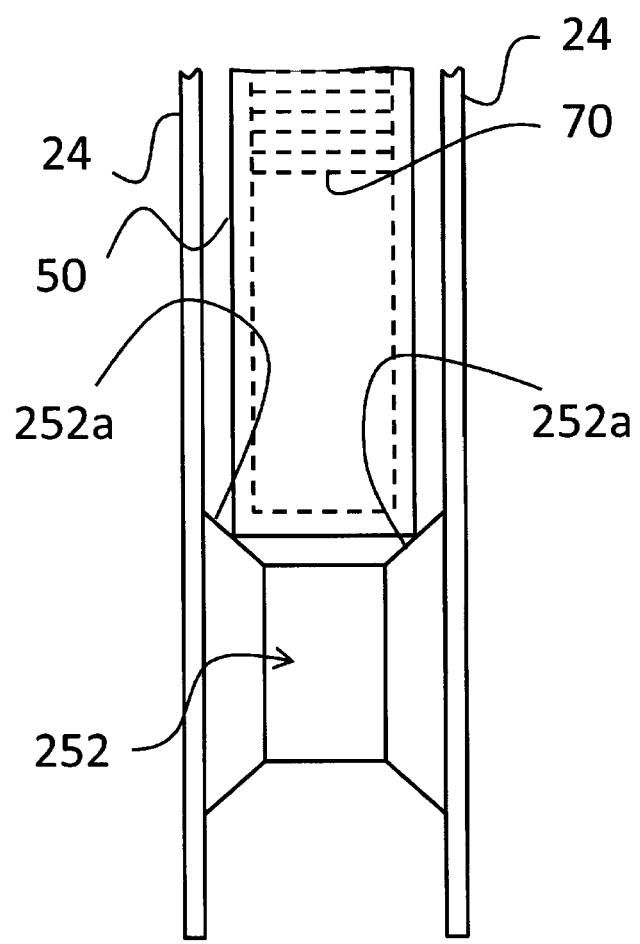
FIG. 13A is an enlarged front view of relevant portions of a housing body stocker according to another embodiment in which a housing body is stored, as viewed in the Y direction.

Although FIG. 12 shows an example in which the supporting member 252 interposed between the pair of partition members 24 includes the gap-forming portions 252a and the protrusion 252b for positioning the housing body 5, the supporting member 252 does not necessarily include both of the gap-forming portions and the protrusion. For example, when the housing body 5 is a box-shaped case as shown in FIG. 13A, the supporting member 252 does not need to include the protrusion, and a supporting member 252 including inclined surfaces descending in a direction away from the partition members 24 as the gap-forming portions 252a may be used.

Figure 13B:
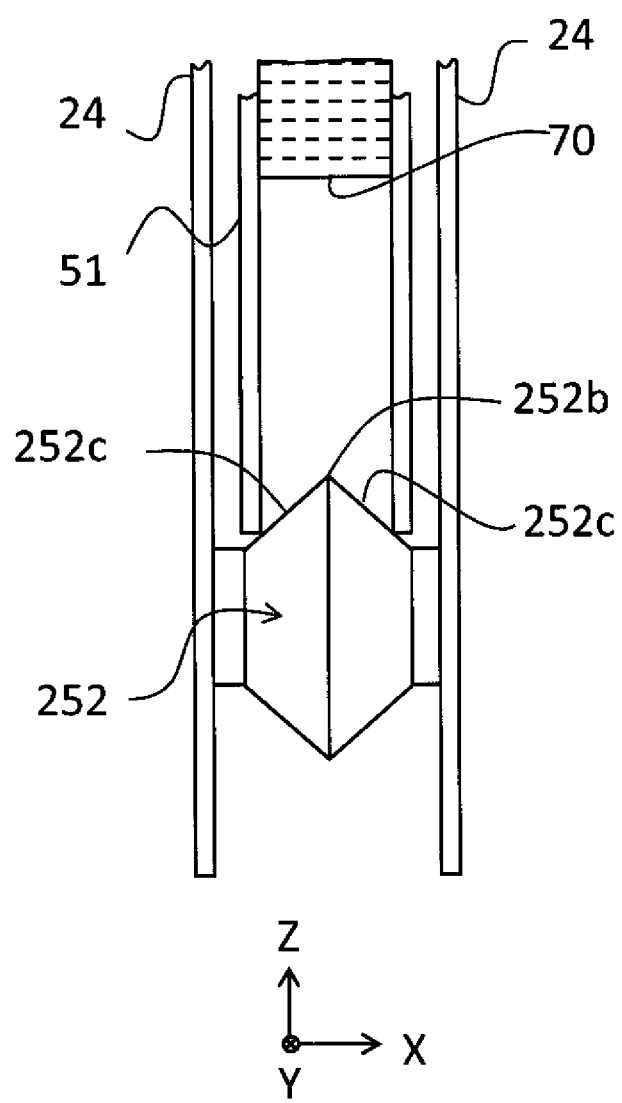
FIG. 13B is an enlarged front view of relevant portions of a housing body stocker according to yet another embodiment in which a housing body is stored, as viewed in the Y direction.

When the housing body 5 is a reel as shown in FIG. 13B, the supporting member 252 may include, at the center thereof, a protrusion 252b that can enter the tape housing gap 5s, and include, on both sides thereof, inclined surfaces 252c descending in a direction away from the protrusion 252b as the gap-forming portions.

[2. Configuration of Replacement Device]

Figure 14:
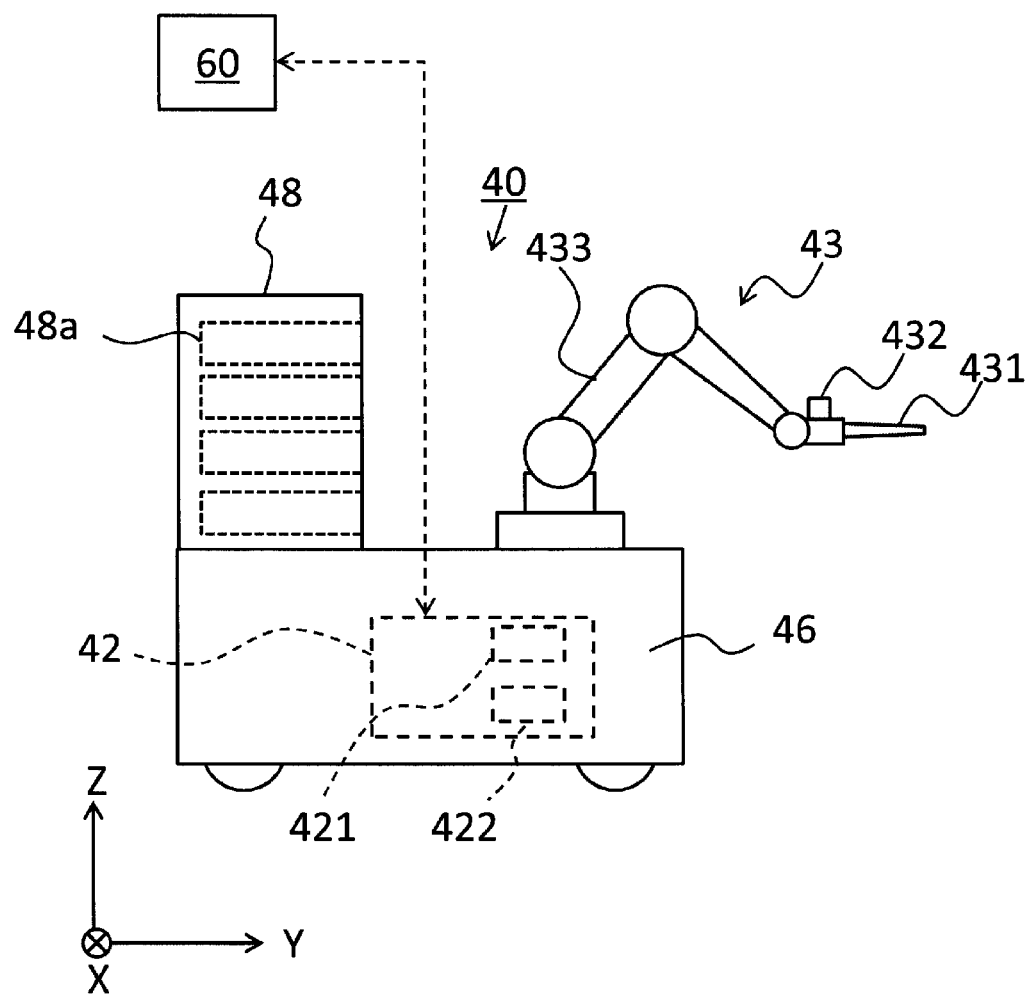
FIG. 14 is a side view showing a schematic configuration of a replacement device according to an embodiment of the present invention.

As shown in FIG. 14, the replacement device 40 includes, for example, a replacement device control unit 42, a robot mechanism 43, a travel mechanism 46, and a component storage portion 48.

The replacement device control unit 42 controls the robot mechanism 43, the travel mechanism 46, and so forth, and has a wireless communication function. For example, the replacement device control unit 42 is capable of performing wireless communication directly or indirectly with the system control unit 11 included in the component mounting device 10. The replacement device control unit 42 is capable of exchanging information with the component mounting device 10, for example, by mutually communicating with the host system 60.

The host system 60 includes a management computer, a storage unit, and so forth. The host system 60 transmits, to the replacement device control unit 42 of the replacement device 40, the commands relating to the destination of the replacement device 40, the content of work performed by the robot mechanism 43, the housing body 5 for which work is to be performed, the storage space S, and so forth. Note that part or all of the storage unit may be provided in the cloud via a server.

The robot mechanism 43 is, for example, an articulated robot, and is equipped with an end effector 431 at a distal end of a robot arm 433. The robot arm 433 has joints that are driven by a servo motor, and the position and the orientation of the end effector 431 are adjusted by bending the robot arm at the joints. The end effector 431 may be able to hold the housing body 5 and release the holding, and may have the function of, for example, gripping, sucking, or the like. The end effector 431 according to the present embodiment is a pair of fingers that hold the housing body 5 by sandwiching the housing body 5 therebetween in the thickness direction (see FIG. 15). The end effector 431 may include a pressure-sensitive sensor for detecting a contact with the assist portion 24A of the housing body stocker 21 during replacement work of the housing body 5.

The robot mechanism 43 includes a moving camera 432. The moving camera 432 captures images of, for example, the housing body identification mark, the carriage unit identification mark, the supply device identification mark, the position identification mark, and so forth.

The travel mechanism 46 may include wheels, a drive device (e.g., a motor) for the wheels, a direction-changing mechanism for the wheels, and so forth.

The replacement device control unit 42 performs control of the robot mechanism 43 and the travel mechanism 46. The replacement device control unit 42 includes a contact detection unit 421. The contact detection unit 421 has the function of detecting that the end effector 431 or the housing body 5 held by the end effector 431 has come into contact with some object. In the present embodiment, the contact detection function of the contact detection unit 421 is utilized for detecting that the end effector 431 or the housing body 5 held by the end effector 431 has come into contact with the partition member 24 (the assist portion 24A). For the contact detection unit 421, it is possible to adopt, for example, a method in which a contact is determined using signals from a pressure-sensitive sensor, a strain sensor, or the like attached to the end effector 431, or a method in which a contact is determined by detecting the load of the servo motor of the robot arm 433.

The replacement device control unit 42 may include an object recognition unit 422. The object recognition unit 422 recognizes, from images captured by the moving camera 432, an identification code or an identification mark such as a bar code or a two-dimensional code, a position reference mark, and the like, and recognizes the identification information of the housing body 5, the positions of the housing body 5, the feeder cart 20, the component supply device 30, the storage space S, and so forth.

The component storage portion 48 includes a plurality of storage racks 48a that can be accessed by the robot mechanism 43. A used housing body 5 and a new housing body 5 for replacement may be mounted in each storage rack 48a. The replacement device 40 mounts a housing body 5 supplied from a predetermined component storage 50 (see FIG. 1) in the storage rack 48a, and transports the housing body 5 to a feeder cart 20 to be replenished. The replacement device 40 mounts a used housing body 5 in the storage rack 48a, and transports the used housing body 5 to a predetermined recovery location for used housing bodies. The replacement device 40 performs replacement work of replacing the housing body 5 in the housing body stocker 21 by using the end effector 431. Note that the replacement work includes pick-up work of picking up the housing body from the storage space S and storage work of storing the housing body 5 in the storage space S.

Next, with reference to FIGS. 15 and 16, a further description will be given of the pick-up work of automatically picking up a used housing body 5 stored in the storage space S from the storage space S by the end effector 431 included in the robot mechanism 43. Here, the description will be given for a case where the end effector 431 includes a pair of gripping portions that grip the housing body 5.

The replacement device 40 that has received a command from the host system 60 moves to a position at which a feeder cart 20 is installed in which a housing body 5X to be replaced is stored, and performs the replacement work. However, there may occur a considerable error in the relative positional relationship between the end effector 431 and the housing body 5X stored in the storage space S. In addition, the orientation of the housing body 5X in the storage space S varies. Therefore, usually, it is difficult to immediately align the position of the end effector 431 accurately with a position at which the housing body 5X can be held.

On the other hand, the replacement device 40 has a level of precision that at least allows the end effector 431 to be inserted into a given position of the storage space S that stores the housing body 5X to be replaced. In addition, the partition members 24 including the assist portion 24A are alternately disposed. Therefore, it is easy to insert the end effector 431 into a given position of the region sandwiched between a pair of partition members 24 including the assist portion 24A, and allow the end effector 431 to access the assist portion 24A that faces the storage space S of the housing body 5X.

Specifically, as shown in (a1) and (b1) of FIG. 15, the replacement device 40 first brings the end effector 431 adjacent to the assist portions 24A of partition members 24 that partition the storage space S in which a housing body 5X to be replaced is stored (step (a1)), and subsequently positions the end effector 431 by moving the end effector 431 in the thickness direction of the partition members 24 so as to come into contact with the assist portion 24A that faces the storage space S in which the housing body 5X is stored (step (b1)). At this time, the assist portion 24A may be elastically deformed in the thickness direction by an external force from the end effector 431. The movement of the end effector 431 may be stopped once the contact detection unit 421 has detected the contact. By using the contact detection unit 421, the replacement device control unit 42 can recognize the position at which the replacement work is to be performed, that is, the position at which the end effector 431 is to be stopped, and accurately position the end effector 431 relative to the storage space S.

Figure 15:
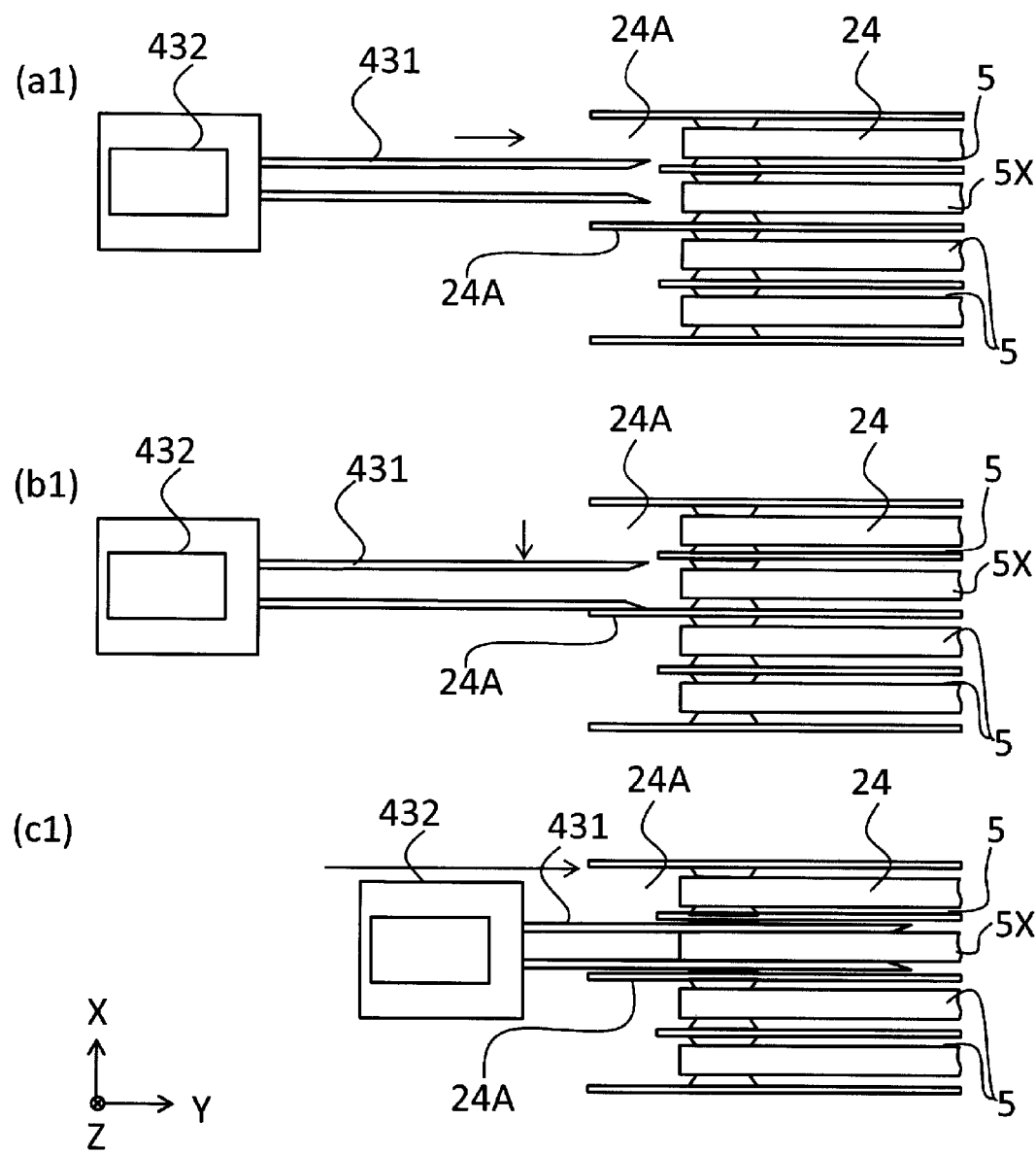
FIG. 15 is a process diagram of work of automatically picking up a used housing body from a storage space by an end effector, as viewed in the Z direction.
Figure 16:
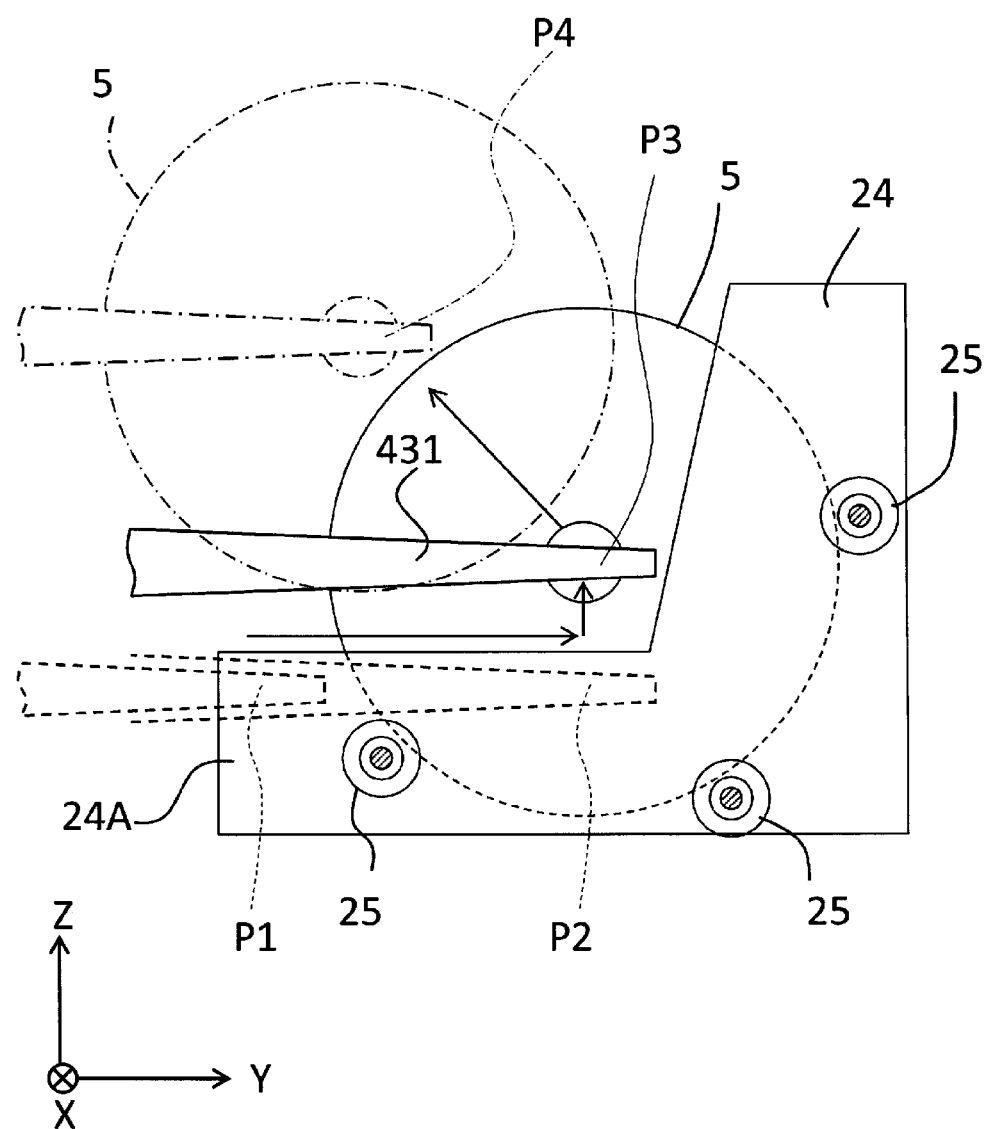
FIG. 16 is a process diagram of the work of automatically picking up a used housing body from a storage space by an end effector, as viewed in the X direction.

As shown in (c1) of FIG. 15, the replacement device 40 then moves the end effector 431 toward the back of the storage space S in a state in which the end effector 431 is in contact with the assist portion 24A or the partition member 24. At this time, if necessary, the interval between the pair of gripping portions may be adjusted to be an interval that allows the housing body 5X to be gripped. By moving the end effector 431 while keeping the end effector 431 in contact with the assist portion 24A or the partition member 24, the end effector 431 can enter into the back of the storage space S with a minimum interference with the housing body 5X. The distal end portion of the end effector 431 may have a surface tapered from the side (inner side) in contact with the housing body 5 toward the other side (the outer side) as shown in the illustrated example, and the thickness of the distal end portion may be gradually reduced. This makes it easier to suppress the interference between the end effector 431 and the housing body 5X.

In the case where a gap is formed between the housing body 5X stored in the storage space S and the assist portion 24A, the end effector 431 may be moved while being inserted into the gap at least in step (b1) to step (c1). This prevents the collision between the distal end of the end effector 431 and the housing body 5X, or suppresses the friction and the resistance received by the end effector 431 from the housing body 5X, thus facilitating the movement of the end effector 431. For example, as shown in FIG. 16, the end effector 431 is inserted into the storage space S by being moved from a first position P1, located below the housing body 5X, where a sufficient gap is formed, to a second position P2 located further back.

Then, the replacement device 40 performs work of moving the end effector 431 to a position for holding the housing body 5X. For example, as shown in FIG. 16, the end effector 431 moves from the second position P2 below the housing body 5 to a third position P3 that is located further above and at which the end effector 431 can grip a portion in the vicinity of the center of the housing body 5X. At the third position P3, the end effector 431 holds the housing body 5X, and moves the housing body 5X to the outside of the storage space S. At this time, by moving the housing body 5X to a fourth position P4 located obliquely upward of the third position P3, the housing body 5X can be picked up with a minimum interference with the partition member 24. The used housing body 5X may be recovered into a recovery rack or the like provided in the replacement device 40.

Then, the replacement device 40 performs storage work of storing another housing body 5 in the storage space S from which the housing body 5 has been picked up. The replacement device 40 picks up a new housing body 5 from the storage rack 48a of the component storage portion 48, brings the housing body 5 gripped by the end effector 431 adjacent to the assist portions 24A of partition members 24 that partition a storage space S in which a new housing body 5 is to be stored, as shown in (a2) and (b2) of FIG. 17 (step (a2)), and subsequently moves the end effector 431 in the thickness direction of the partition members 24 so as to bring the housing body 5 into contact with the assist portion 24A (step (b2)). At this time, the assist portion 24A may be elastically deformed in the thickness direction by an external force from the housing body 5. Through the contact between the housing body 5 and the assist portion 24A, the replacement device control unit 42 recognizes, via a predetermined detection function, the position at which the replacement work is to be performed, that is, the position from which the housing body 5 is to be move further to the back of the storage space S. That is to say, the positioning of the housing body 5 is performed.

Figure 17:
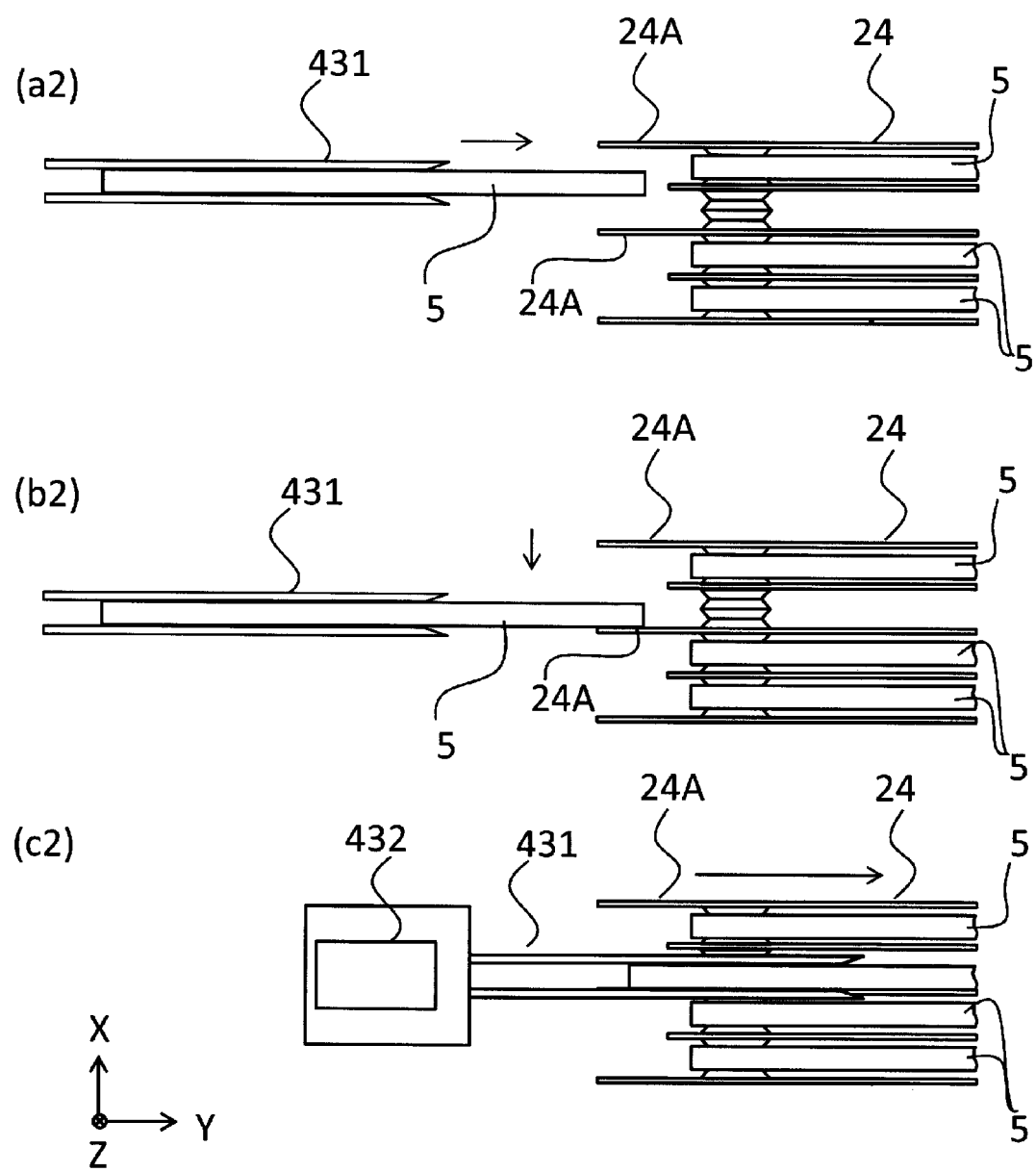
FIG. 17 is a process diagrams of work of automatically storing a new housing body in a storage space by an end effector, as viewed in the Z direction.
Figure 18:
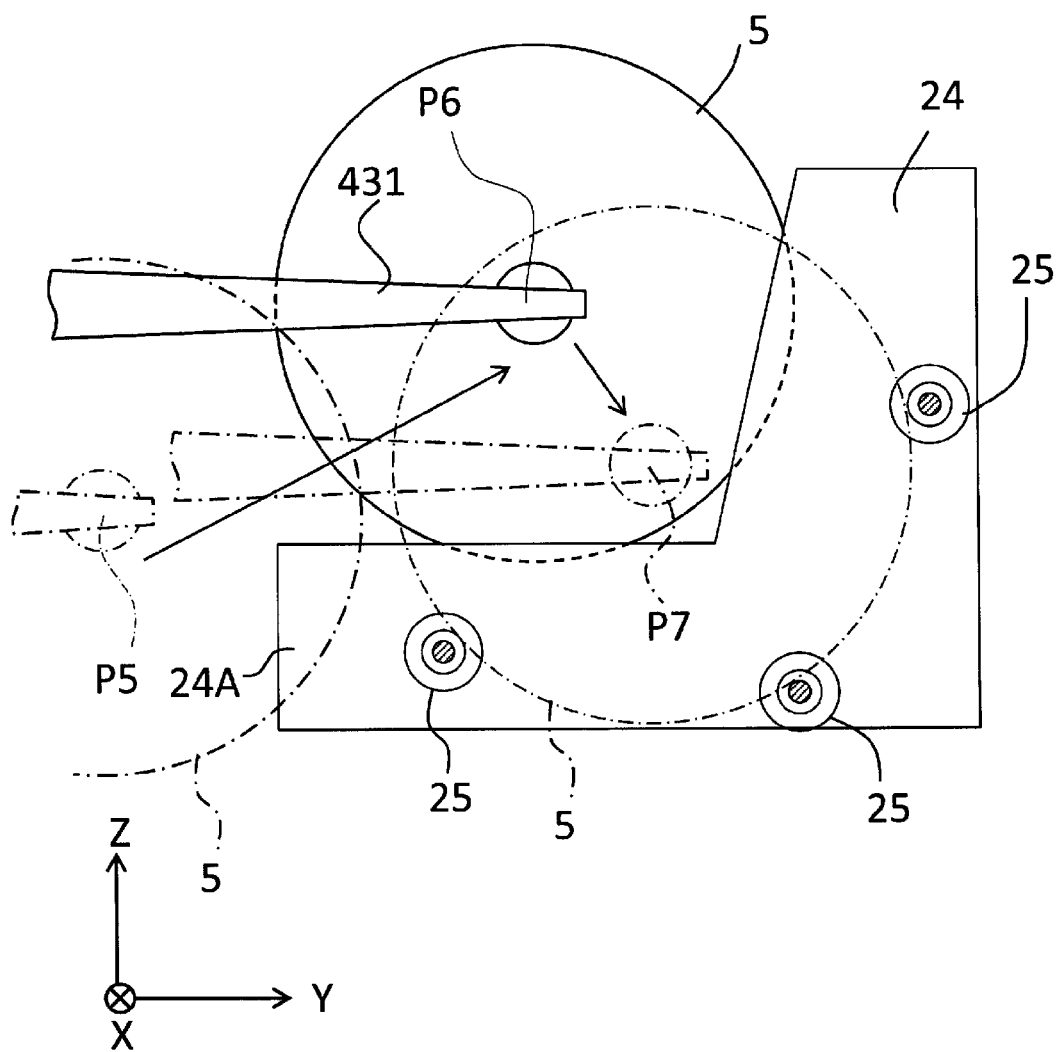
FIG. 18 is a process diagram of the work of automatically storing a new housing body in a storage space by an end effector, as viewed in the X direction.

Then, as shown in (c2) of FIG. 17, the replacement device 40 moves the housing body 5 to the back of the storage space S. At this time, as shown in FIG. 18, the housing body 5 may be temporarily caused to travel upward. Specifically, the housing body 5 may be moved from a fifth position P5 at which the housing body 5 has been brought into contact with the assist portion 24A, to a sixth position P6 located obliquely upward therefrom. Thereafter, the end effector 431 is moved to a seventh position P7 at which the holding of the housing body 5 is to be released, and the holding of the housing body 5 is released, whereby the storage of the housing body 5 in the storage space S is completed. Thereafter, the end effector 431 is moved away from the storage space S. By moving the housing body 5 to the seventh position P7 after temporarily causing the housing body 5 to travel obliquely upward in this manner, the housing body 5 can be easily stored in the storage space S with a minimum interference with the partition member 24.

Note that the above-described embodiments should not be construed as limiting the present invention. For example, it is possible to use a replacement device 40 of a type that does not include the contact detection unit 421.

INDUSTRIAL APPLICABILITY

With the mounting substrate manufacturing system and the component mounting system according to the present disclosure, the automatic replacement of a housing body that houses a carrier tape and is stored in a housing body stocker is facilitated.

REFERENCE SIGNS LIST

1: Component mounting system
2: Mounting substrate manufacturing system
3: Communication network
5: Housing body
10: Component mounting device (chip mounter)
11: System control unit
12: Component mounting portion
102: Base, 121: Substrate transport conveyor, 122: Substrate positioning portion
123: Head movement mechanism,
123Y: Y-axis table, 123X: X-axis table,
124: Head camera,
125: Mounting head, 126: Component holding nozzle,
127: Component recognition camera, 128: HMI
20: Feeder cart
21: Housing body stocker (21A: Upper stocker, 21B: Lower stocker), 22: Feeder mounting portion,
22a: Supporting post, 23: Carriage portion, 23a: Wheel, 23b: Supporting base, 24: Partition member,
24A: Assist portion
25: Coupling member
251: Rod main body, 252: Supporting member, 252a: Gap-forming portion,
252b: Protrusion
30: Component supply device (tape feeder)
40: Replacement device
42: Replacement device control unit
46: travel mechanism
48: Component storage portion, 48a: Storage rack
50: Component storage
60: Host system
70: Carrier tape
71: Component accommodating portion, 72: Tape main body, 73: Top tape
S: Storage space

The invention claimed is:

1. A mounting substrate manufacturing system comprising:
    a component mounting system including: a chip mounter that picks a component from a carrier tape and mounts the component on a substrate; a housing body stocker that stores a housing body that houses the carrier tape; and a tape feeder that pulls out the carrier tape from the housing body stored in the housing body stocker and transports the carrier tape to the chip mounter; and
    a replacement device that includes an end effector for holding the housing body, and replaces the housing body stored in the housing body stocker,
    wherein the housing body stocker includes at least a pair of partition members that partition a storage space for storing the housing body, and
    at least one of the partition members adjacent to each other includes an assist portion that assists a replacement operation of replacing the housing body,
    wherein the replacement device brings the end effector or the housing body held by the end effector into contact with the assist portion by bringing the end effector or the housing body held by the end effector adjacent to the assist portion, and thereafter moving the end effector or the housing body held by the end effector in a thickness direction of the partition members,
    wherein the partition members are elastically deformed in a thickness direction thereof by an external force generated when the partition members come into contact with the end effector or the housing body held by the end effector.

2. The mounting substrate manufacturing system according to claim 1,
wherein the housing body stocker includes a plurality of aligned pairs of the partition members, and
the partition members including the assist portion are alternately disposed.

3. The mounting substrate manufacturing system according to claim 1,
wherein a side surface of the at least one of the partition members that faces the storage space functions as the assist portion.

4. The mounting substrate manufacturing system according to claim 1,
wherein the assist portion has an area that is not shielded by the housing body stored in the storage space.

5. The mounting substrate manufacturing system according to claim 1,
wherein the end effector includes a pair of gripping portions that grip the housing body, and
at least one of the gripping portions comes into contact with the assist portion.

6. The mounting substrate manufacturing system according to claim 1,
wherein the housing body stored in the storage space is positioned such that a gap is formed between the housing body and each of the partition members.

7. The mounting substrate manufacturing system according to claim 6,
wherein the housing body stocker includes a gap-forming portion that forms a gap between the housing body stored in the storage space and each of the partition members.

8. The mounting substrate manufacturing system according to claim 7,
wherein the housing body stocker includes a supporting member that supports the housing body in the storage space, and the gap-forming portion is formed on the supporting member.

9. A component mounting system comprising:
a chip mounter that picks a component from a carrier tape and mounts the component on a substrate;
a housing body stocker that stores a housing body that houses the carrier tape; and
a tape feeder that pulls out the carrier tape from the housing body stored in the housing body stocker and transports the carrier tape to the chip mounter,
wherein the housing body stocker includes at least a pair of partition members that partition a storage space for storing the housing body, and
at least one of the partition members adjacent to each other includes an assist portion that assists a replacement operation in which a replacement device including an end effector for holding the housing body and replacing the housing body stored in the housing body stocker,
wherein the replacement device brings the end effector or the housing body held by the end effector into contact with the assist portion by bringing the end effector or the housing body held by the end effector adjacent to the assist portion, and thereafter moving the end effector or the housing body held by the end effector in a thickness direction of the partition members,
wherein the partition members are elastically deformed in a thickness direction thereof by an external force generated when the partition members come into contact with the end effector or the housing body held by the end effector.

10. The component mounting system according to claim 9,
wherein the housing body stocker includes a plurality of aligned pairs of the partition members, and
the partition members including the assist portion are alternately disposed.

11. The component mounting system according to claim 9,
wherein a side surface of the at least one of the partition members that faces the storage space functions as the assist portion.

12. The component mounting system according to claim 9,
wherein the assist portion has an area that is not shielded by the housing body stored in the storage space.

13. The component mounting system according to claim 9,
wherein the housing body stored in the storage space is positioned such that a gap is formed between the housing body and each of the partition members.

14. The component mounting system according to claim 13,
wherein the housing body stocker includes a gap-forming portion that forms a gap between the housing body stored in the storage space and each of the partition members.

15. The component mounting system according to claim 14,
wherein the housing body stocker includes a supporting member that supports the housing body in the storage space, and the gap-forming portion is formed on the supporting member.

16. A housing body transfer method performed,
in a component mounting system including: a chip mounter that picks a component from a carrier tape and mounts the component on a substrate; a housing body stocker that stores a housing body that houses the carrier tape; and a tape feeder that pulls out the carrier tape from the housing body mounted in the housing body stocker and transports the carrier tape to the chip mounter, when picking up the housing body stored in the housing body stocker by a replacement device including an end effector for holding the housing body,
wherein the housing body stocker includes at least a pair of partition members that partition a storage space for storing the housing body, and
at least one of the partition members adjacent to each other includes an assist portion that assists a replacement operation of replacing the housing body, the method comprising the steps of:
bringing the end effector in a state before picking up the housing body stored in the storage space, into contact with the assist portion;
moving, in a state in which the end effector is in contact with the assist portion, the end effector to a position for holding the end effector; and
holding the housing body by the end effector, and moving the housing body to outside of the storage space, thus picking up the housing body,
wherein the step of bringing the end effector into contact with the assist portion includes bringing the end effector adjacent to the assist portion, and thereafter moving the end effector in a thickness direction of the partition members,
wherein the step of bringing the end effector into contact with the assist portion includes elastically deforming the partition members in a thickness direction thereof by an external force generated when the end effector is brought into contact with the partition members.

\* \* \* \* \*